United States Patent
Li et al.

(10) Patent No.: US 12,046,308 B2
(45) Date of Patent: Jul. 23, 2024

(54) OTP MEMORY AND METHOD FOR MANUFACTURING THEREOF, AND OTP CIRCUIT

(71) Applicant: CHANGXIN MEMORY TECHNOLOGIES, INC., Hefei (CN)

(72) Inventors: Xiong Li, Hefei (CN); Huangxia Zhu, Hefei (CN); Peng Feng, Hefei (CN)

(73) Assignee: CHANGXIN MEMORY TECHNOLOGIES, INC., Hefei (CN)

(*) Notice: Subject to any disclaimer, the term of this patent is extended or adjusted under 35 U.S.C. 154(b) by 117 days.

(21) Appl. No.: 17/647,845

(22) Filed: Jan. 12, 2022

(65) Prior Publication Data

US 2022/0343987 A1 Oct. 27, 2022

Related U.S. Application Data

(63) Continuation of application No. PCT/CN2021/111889, filed on Aug. 10, 2021.

(30) Foreign Application Priority Data

Apr. 23, 2021 (CN) .......................... 202110444444.4

(51) Int. Cl.
*H10B 20/20* (2023.01)
*G11C 17/16* (2006.01)
*G11C 17/18* (2006.01)

(52) U.S. Cl.
CPC .............. *G11C 17/16* (2013.01); *G11C 17/18* (2013.01); *H10B 20/20* (2023.02)

(58) Field of Classification Search
CPC ................................ H10B 20/20; G11C 17/16
USPC ............................................................ 365/96
See application file for complete search history.

(56) References Cited

U.S. PATENT DOCUMENTS

| | | | | |
|---|---|---|---|---|
| 6,630,724 | B1* | 10/2003 | Marr | G11C 17/16 365/225.7 |
| 2002/0020881 | A1* | 2/2002 | Okawa | H01L 27/0262 257/361 |
| 2002/0173098 | A1* | 11/2002 | Tang | H01L 27/0255 438/255 |
| 2007/0215948 | A1* | 9/2007 | Yang | H01L 27/0255 257/734 |
| 2011/0103127 | A1 | 5/2011 | Kurjanowicz | |
| 2015/0380400 | A1* | 12/2015 | Jonishi | H01L 21/823892 257/369 |
| 2016/0078962 | A1* | 3/2016 | Park | H10B 20/20 365/96 |
| 2021/0151427 | A1* | 5/2021 | Shimizu | H01L 27/0629 |

FOREIGN PATENT DOCUMENTS

| | | |
|---|---|---|
| CN | 101506901 A | 8/2009 |
| CN | 102385932 A | 3/2012 |
| CN | 102612717 A | 7/2012 |
| CN | 104851885 A | 8/2015 |
| CN | 105869678 A | 8/2016 |

OTHER PUBLICATIONS

International Search Report in Application No. PCT/CN2021/111889, mailed on Jan. 8, 2022.

* cited by examiner

*Primary Examiner* — Muna A Techane
(74) *Attorney, Agent, or Firm* — Syncoda LLC; Feng Ma

(57) ABSTRACT

A One Time Programmable (OTP) memory can have a memory cell, which includes two series diodes as a fuse structure.

9 Claims, 6 Drawing Sheets

OTP MEMORY AND METHOD FOR MANUFACTURING THEREOF, AND OTP CIRCUIT

CROSS-REFERENCE TO RELATED APPLICATIONS

The present application is a continuation of International Patent Application No. PCT/CN2021/111889 filed on Aug. 10, 2021, which claims priority to Chinese Patent Application No. 202110444444.4 filed on Apr. 23, 2021. The disclosures of the above-referenced applications are hereby incorporated by reference in their entirety.

TECHNICAL FIELD

The present disclosure relates to the technical field of memories, and in particular, to a One Time Programmable (OTP) memory and a method for manufacturing thereof, and an OTP circuit.

BACKGROUND

An OTP is a memory implemented by a semiconductor structure. After data is written once, no write operation is performed, and subsequent multiple data reads are supported. Due to its write-once property, the OTP is applied to technical fields such as data-invariable keys, chip storage, redundant design, and radio frequency identification, and is used for processing data.

SUMMARY

The present disclosure provides an OTP memory and a method for manufacturing thereof, and an OTP circuit.

The present disclosure provides an OTP memory, comprising:

a first active region, a second active region, and an isolation region provided between the first active region and the second active region, wherein a conductivity type of the first active region is different from a conductivity type of the second active region;

a first diffusion region provided on the first active region and configured to be connected to a first connecting line, wherein the conductivity type of the first active region is different from a conductivity type of the first diffusion region; and a second diffusion region provided on the second active region and configured to be connected to a second connection line.

The present disclosure provides a method for manufacturing an OTP memory, comprising:

a semiconductor substrate is provided;

a semiconductor layer is formed on the semiconductor substrate, wherein the semiconductor layer comprises a first active region and a second active region, and a conductivity type of the first active region is different from a conductivity type of the second active region;

an isolation region is formed on the semiconductor layer, the isolation region is provided between the first active region and the second active region;

a first diffusion region is formed on the first active region, wherein the conductivity type of the first active region is different from a conductivity type of the first diffusion region;

a second diffusion region is formed on the second active region;

the first diffusion region is connected to a first connecting line; and the second diffusion region is connected to a second connecting line.

The present disclosure provides an OTP circuit, comprising:

a plurality of first connection lines, a plurality of second connection lines and a plurality of memory cells, wherein each of plurality of the second connection lines is connected to at least one of the plurality of memory cells, and each of plurality of the second connection lines is connected to the plurality of first connection lines by means of the at least one of the plurality of memory cells, respectively;

each of the plurality of memory cells comprises a first diode and a second diode; a cathode of the first diode is connected to each of the plurality of first connection lines, an anode of the first diode is connected to an anode of the second diode, and a cathode of the second diode is connected to each of the plurality of second connection lines.

BRIEF DESCRIPTION OF THE DRAWINGS

In order to illustrate the technical solutions in the embodiments of the present disclosure or the related art in a more apparent manner, the drawings used for illustrating the embodiments of the present disclosure and the related art will be described briefly below. Obviously, the following drawings merely show some of the embodiments of the present disclosure, and based on these drawings, a person skilled in the art may obtain the other drawings without any creative effort.

DETAILED DESCRIPTION

Figure 1:
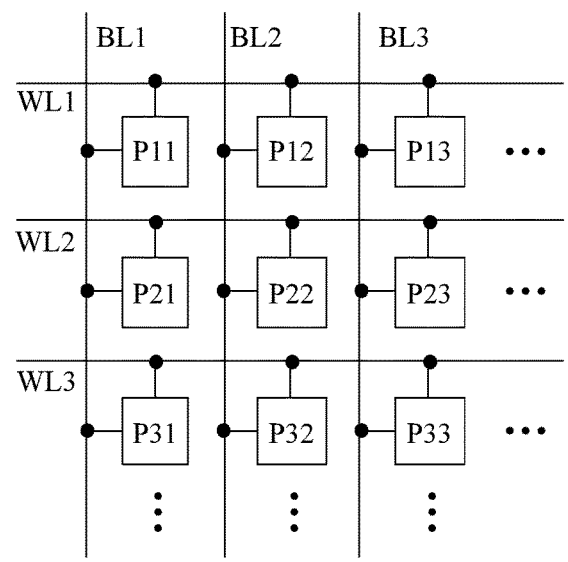
FIG. 1 is a schematic structural diagram of an equivalent circuit of an OTP memory array.

Hereinafter, the technical solutions of the embodiments of the present disclosure will be described in a clearly and fully understandable way in connection with the drawings in the embodiments of the present application. It is obvious that the described embodiments are just a part but not all of the embodiments of the present disclosure. Based on the described embodiments of the present disclosure herein, those skilled in the art can obtain other embodiment(s), without any inventive work, which should be within the scope of the present application.

The terms "first", "second", "third", "fourth", etc. (if any), in the description, claims, and accompanying drawings of the present disclosure are used to distinguish similar objects, and are not necessarily used to describe a specific sequence or order. It should be understood that data used in this way may be interchanged where appropriate, so that the embodiments of the present disclosure described herein, for example, can be implemented in sequences other than those illustrated or described herein. In addition, the terms "comprising", "having" or other variants aim to cover non-exclusive inclusion, such that the processes systems, articles or devices comprising a series of steps or modules not only comprise those steps or units, but also comprise other factors not listed explicitly, or further comprise steps or units intrinsic for such processes, methods, articles or devices.

In some implementations, an OTP comprises a memory cell using a gate-oxygen structure as a fuse circuit; each memory cell is provided with a source region on a substrate; an N-type diffusion region is provided on the source region; two separate gate structures form two transistors which are respectively a fuse transistor and a control transistor; and when a high level is connected between a word line and a bit line, a gate oxide layer of the fuse transistor is broken down, a gate electrode and a drain electrode are turned on, and the fuse transistor is considered to be fused, so that two states, i.e., a fused state and a non-fused state of the fuse transistor are determined to respectively represent data 1 and data 0.

In some implementations, in two gate structures provided on each memory cell in an OTP memory, a fuse gate corresponds to a thin gate oxide layer, and a control gate corresponds to a thick gate oxide layer. Due to the requirements of a design rule checking (DRC), the distance between two gates is relatively large, resulting in a relatively large volume of a memory cell as a whole, and thus the whole volume of the OTP memory is relatively large and the degree of integration is relatively small, which does not facilitate the promotion and application of an OTP memory in various fields.

Before the embodiments of the present disclosure are introduced in a formal manner, the application scenarios of the present disclosure and problems existing in some implementations are introduced with reference to the accompanying drawings. Specifically, the present disclosure can be applied to a One Time Programmable (OTP) memory. The present disclosure specifically provides an implementation of memory cells in an OTP memory, and each memory cell can provide functions of data writing and data reading of the OTP memory. Due to the write-once property of each memory cell, the OTP is widely applied to fields with high security requirements on data, such as data-invariable keys, chip storage, redundant design, and radio frequency identification. After data is written into a memory, the data cannot be written again, so that the uniqueness and accuracy of the data in the memory can be protected.

In some embodiments, FIG. 1 is a schematic structural diagram of an equivalent circuit of an OTP memory array. The OTP memory array as shown in FIG. 1 comprises a plurality of memory cells. Each memory cell can be used for storing one piece of data "0" or one piece of data "1"; all the plurality of memory cells can be distributed in rows and columns; according to a row-column distribution rule thereof, the plurality of memory cells are denoted as P11, P12, P13 . . . ; and at the same time, the plurality of memory cells are distributed in rows and columns, and are connected to a plurality of word lines (WL) and bit lines (BL) which are also distributed in rows and columns.

For example, in the OTP memory array as shown in FIG. 1, a plurality of word lines are distributed in rows, and are marked as WL1, WL2, WL3, . . . ; a plurality of bit lines are distributed in columns, and denoted as BL1, BL2, BL3, . . . ; and a plurality of memory cells are distributed in a matrix between the word lines and the bit lines. The first row of memory cells are all connected to the word line WL1, the second row of memory cells are all connected to the word line WL2, and so on; the first column of memory cells are all connected to the bit line BL1, the second row of memory cells are all connected to the bit line BL2, and so on, so that each memory cell is connected to a word line and a bit line.

In some embodiments, the word line and the bit line provided in the embodiments of the present disclosure may also be other connection lines or have other names, and the specific implementation of the described connection lines is not limited. For example, the plurality of word lines in FIG. 1 may be denoted as a plurality of first connection lines, the plurality of bit lines may be denoted as second connection lines, and so on, and the connection lines may be used to implement functions corresponding to the word lines or the bit lines.

Figure 2:
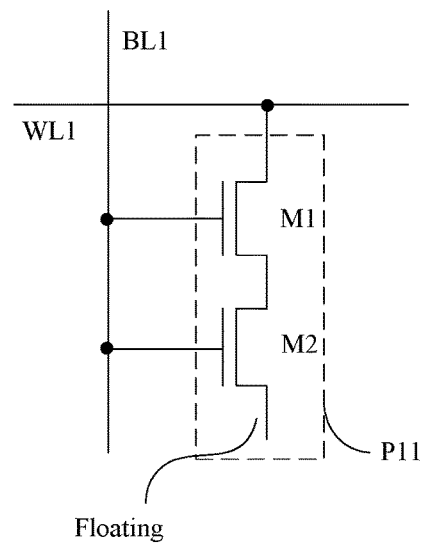
FIG. 2 is a schematic structural diagram of an equivalent circuit of a memory cell based on a gate-oxygen structure in some implementations.

FIG. 2 is a schematic structural diagram of an equivalent circuit of a memory cell based on a gate-oxygen structure in some implementations. In the OTP memory array shown in FIG. 1, taking a memory cell P11 in the first row and the first column as an example, as shown in FIG. 2, the memory cell comprises a first transistor M1 and a second transistor M2. The gate electrodes of the first transistor M1 and the second transistor M2 are both connected to the word line WL1, meanwhile, the drain electrode of the first transistor M1 is connected to the bit line BL1, the source electrode of the first transistor M1 is connected to the drain electrode of the second transistor M2, and the source electrode of the second transistor M2 is in the configuration of a floating gate arrangement.

In some embodiments, the memory cell as shown in FIG. 2 can also be referred to as a gate oxygen fuse memory cell because of a gate structure provided therein, the first transistor M1 and the second transistor M2 are two separated structures in the memory cell, and form a fusing path together between the word line WL1 and the bit line BL1 connected to the first transistor M1 and the second transistor M2. The first transistor M1 can be used for fusing, and is a fuse transistor, and the gate of the first transistor M1 can be referred to as a fuse gate; the second transistor M2 can be used for reading and writing control, and is a control transistor, and the gate of the second transistor M2 can be referred to as a control gate. Each memory cell may store data "1" or store data "0" according to whether the first transistor M1 is fused.

In some embodiments, for the memory cell P11 as shown in FIG. 2, when data "1" needs to be written, a high level is applied to the word line WL1 and a low level is applied to the bit line BL1, so that the fuse gate of the first transistor M1 is broken down, that is, the gate and the drain of the programmed first transistor M1 are conducted. Subsequently, when reading data in the memory cell P11, a high level is applied to the word line WL1, and current data is read on the bit line BL1; when a large current flowing through the memory cell P11 from the word line WL1 is read, it means that a fuse gate in the memory cell P11 is fused, and it is determined that data "1" is stored in the memory cell P11; and when a large current flowing through the memory cell P11 from the word line WL1 is not read, it means that the fuse gate in the memory cell P11 is not fused, and it is determined that data "0" is stored in the memory cell P11.

Figure 3:
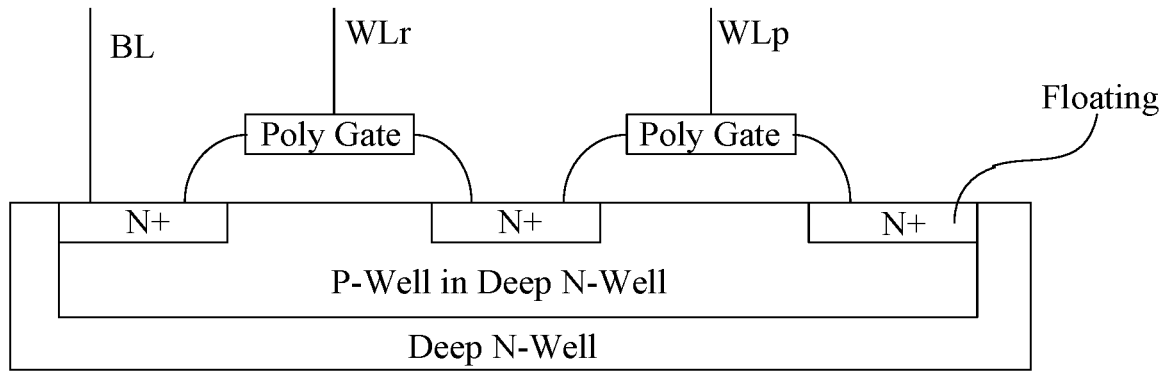
FIG. 3 is a schematic structural diagram of the memory cell based on the gate-oxygen structure in some implementations.

In some embodiments, in order to implement the circuit structure shown in FIG. 2, FIG. 3 is a schematic structural diagram of the memory cell based on the gate-oxygen structure in some implementations, and may be used to implement a circuit of a memory cell shown in FIG. 2. A lowest part of a semiconductor of the memory cell is an N-well (Deep N-Well), and an upper part of the N-well is a P-Well (P-Well in Deep N-Well); an N-type diffusion region is provided on the P-type well; the N-type diffusion region is connected to the bit line BL, a first Poly Gate, a second Poly Gate and a floating gate arrangement, respectively; and the first Poly Gate and the second Poly Gate are connected to a word line WLr and a word line WLp.

In the memory cell as shown in FIG. 3, although fusing and control are achieved by the gate-oxygen structure of the two transistors, two separate gate structures are introduced into the two transistors, and when the two transistors correspond to gate oxide layers with different thicknesses, in consideration of design and engineering rules such as mask alignment and etching process errors, the gate structures of the two transistors in each memory cell need to be spaced by a distance large enough, which causes the volume occupied by each memory cell to be large, thereby causing the whole volume of the OTP memory to be large, relatively reducing the concentration of the memory cell/the OTP memory, and not facilitating the promotion and application of the OTP memory in various fields.

Therefore, the present disclosure provides an OTP memory and a method for manufacturing thereof, and an OTP circuit. By means of the design of a memory cell in the OTP memory, two diodes, N+/PW and PW/NW, are used in series as a fuse structure in the memory cell, thereby preventing the use of a gate-oxygen structure as a fuse path, reducing the volume of the memory cell and reducing the volume of the whole OTP memory, and thus relatively improving the degree of integration of the memory cell/OTP memory.

The technical solution of the present disclosure will be described in detail below with reference to specific embodiments. The following specific embodiments may be combined with each other, and the same or similar concepts or processes may not be repeated in some embodiments.

It should be noted that, the memory cell structure of the diode of the present disclosure can also be applied to other integrated circuit products based on CMOS processes and related semiconductor products. In subsequent embodiments of the present disclosure, the application of the structure of the memory cell in an OTP memory is only an exemplary application, rather than a limitation thereto.

Figure 4:
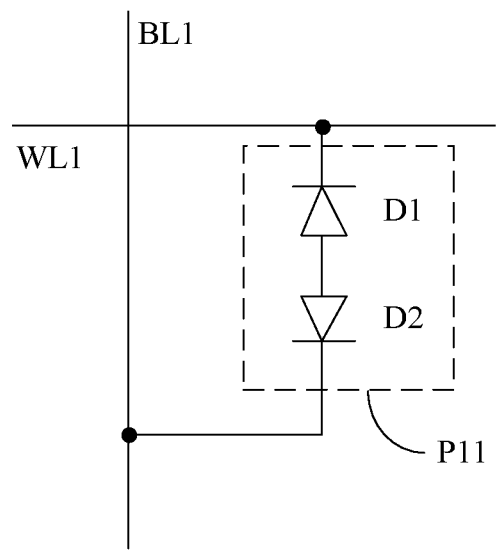
FIG. 4 is a schematic structural diagram of an equivalent circuit structure according to an embodiment of a memory cell provided in the present disclosure.

FIG. 4 is a schematic structural diagram of an equivalent circuit structure according to an embodiment of a memory cell provided in the present disclosure. The memory cell shown in FIG. 4 can be applied to the OTP memory array shown in FIG. 1. In FIG. 4, a memory cell P11 in FIG. 1 is taken as an example to describe the circuit structure of the memory cell in the present embodiment.

Figure 5:
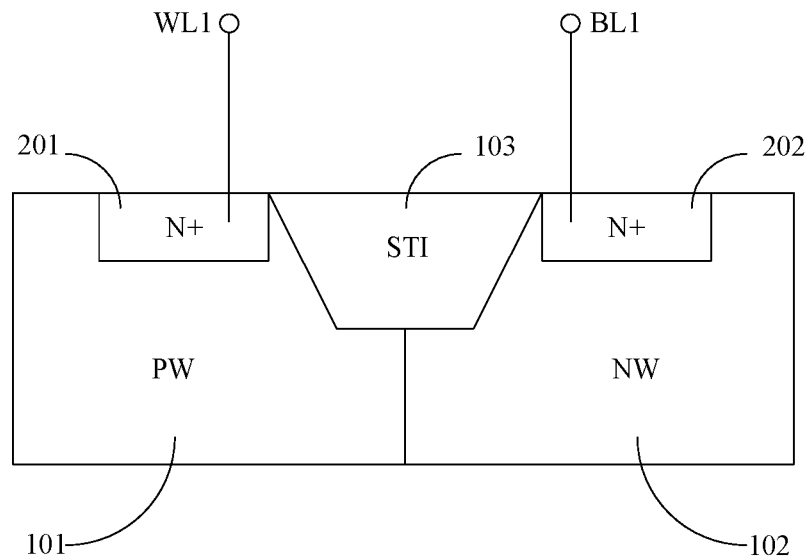
FIG. 5 is a schematic structural diagram according to an embodiment of a memory cell provided in the present disclosure.

In some embodiments, the memory cell P11 as shown in FIG. 4 comprises a first diode D1 and a second diode D2, wherein the cathode of the first diode D1 is connected to a word line WL1, the anode of the first diode D1 is connected to the anode of the second diode D2, and the cathode of the second diode D2 is connected to a bit line BL1. It should be noted that, in a specific implementation structure of the second diode D2, an active region forming a cathode may be connected to the bit line BL1 specifically through a diffusion region, and for a specific structure, reference may be made to a schematic structural diagram as shown in FIG. 5.

In some embodiments, a breakdown voltage V1 of the first diode D1 is less than a breakdown voltage V2 of the second diode D2.

In some embodiments, for the memory cell P11 as shown in FIG. 4, when data "1" needs to be written, a high level V3 is applied to the word line WL1, a low level 0V is applied to the bit line BL1, V1 less than or equal to V3 less than or equal to V2, and the voltage on both sides of the memory cell P11 causes the first diode D1 to be broken down.

Subsequently, when data in the memory cell P11 is read, a high level is applied to the word line WL1, and current data is read on the bit line BL1; when it is read that a current flowing through the memory cell P11 from the word line WL1 is greater than a preset value, it means that the first diode D1 in the memory cell P11 is broken down, so that the resistance of the memory cell P11 is reduced and the current is increased; it is determined that data "1" is stored in the memory cell P11; and when a current flowing through the memory cell P11 from the word line WL1 is not read, it means that the first diode D1 in the memory cell P11 is not broken down, and it is determined that data "0" is stored in the memory cell P11.

In some embodiments, FIG. 5 is a schematic structural diagram according to an embodiment of a memory cell provided in the present disclosure. The structure of the memory cell shown in FIG. 5 can be used to implement the equivalent circuit shown in FIG. 4. In FIG. 5, the memory cell P11 is also taken as an example, and the memory cell includes:

a first active region 101, a second active region 102 and an isolation region 103, wherein a conductivity type of the first active region 101 is different from a conductivity type of the second active region 102.

In specific implementation, according to different types of ion implantation of the first active region 101 and the second active region 102, the first active region 101 may be set to be a P-type well (PW), and the second active region 102 may be set to be an N-well (NW), so that the conductivity type of the first active region 101 is different from the conductivity type of the second active region 102.

Figure 6:
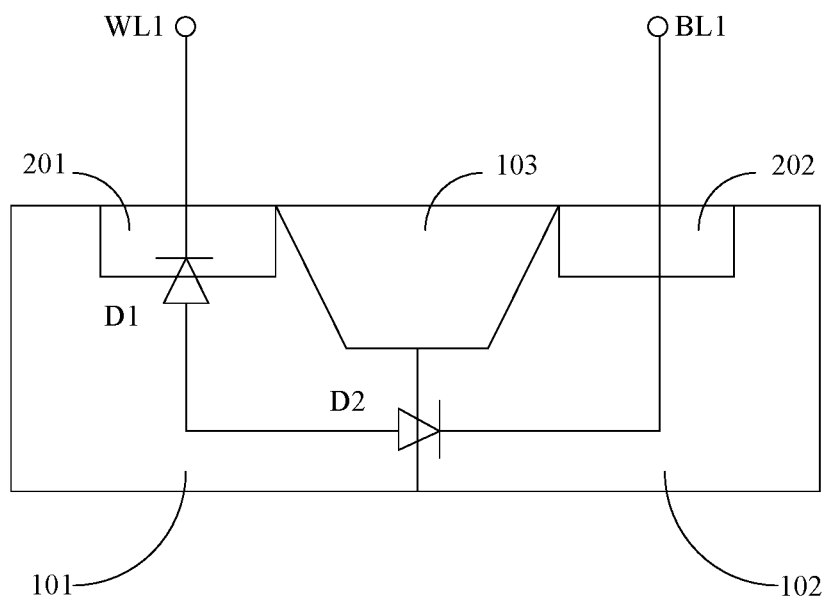
FIG. 6 is a schematic structural diagram of an equivalent circuit structure according to an embodiment of a memory cell provided in the present disclosure.

FIG. 6 is a schematic structural diagram of an equivalent circuit structure according to an embodiment of a memory cell provided in the present disclosure. As shown in FIG. 6, on the basis of FIG. 5, an equivalent second diode D2 may be formed between a first active region 101 of a P-type well and a second active region 102 of an N-well according to different conductivity types. An anode of the second diode D2 is on a side with the first active region 101, and a cathode of the second diode D2 is on a side with the second active region 102.

In some embodiments, the isolation zone 103 may be implemented by shallow trench isolation (STI) technology.

The first active region 101 is further provided with a first diffusion region 201 for connecting the word line WL1; and the second active region 201 is further provided with a second diffusion region 202 for connecting the bit line BL1. The conductivity type of the first active region 101 is different from a conductivity type of the first diffusion region 201.

In specific implementation, the first diffusion region 201 may be an N-type diffusion region (N+), and the second diffusion region 202 may also be an N-type diffusion region (N+). As shown in FIG. 6, an equivalent first diode D1 may be formed between the N-type first diffusion region 201 and the first active region 101 of the P-type well according to different conductivity types. An anode of the first diode D1 is on the side with first active region 101, and a cathode of the first diode D1 is on a side with first diffusion region 201.

Figure 7:
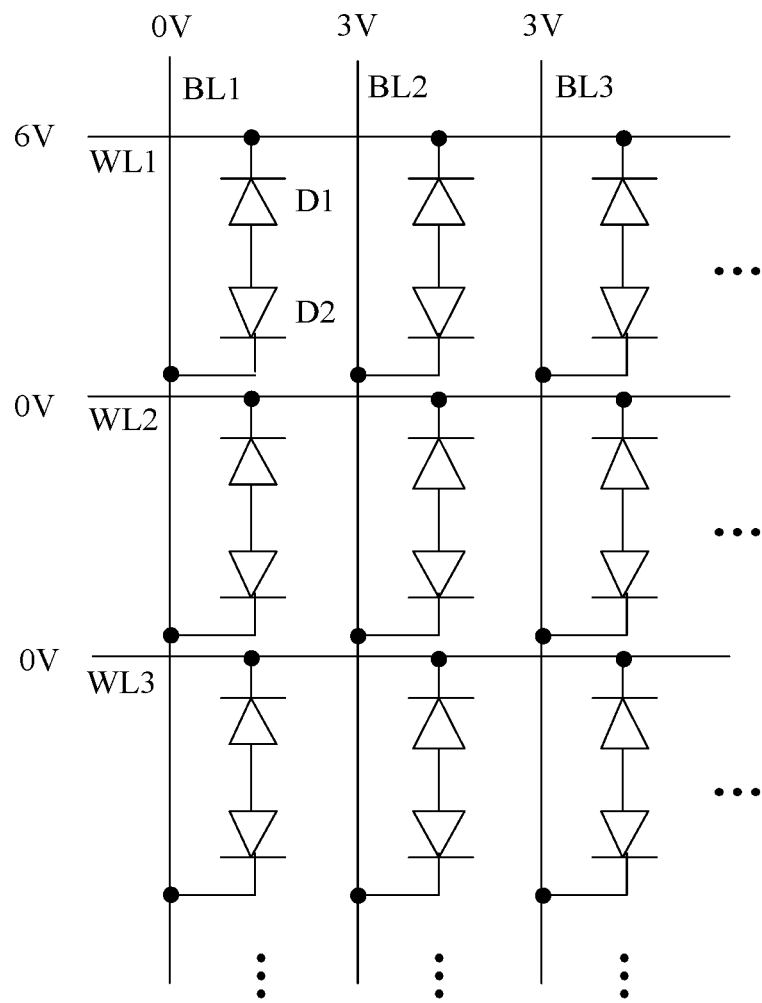
FIG. 7 is a schematic structural diagram of an equivalent circuit structure of an OTP memory array according to an embodiment of the present disclosure.

FIG. 7 is a schematic structural diagram of an equivalent circuit structure of an OTP memory array according to an embodiment of the present disclosure. FIG. 7 shows a specific circuit structure of the OTP memory array after the OTP memory array shown in FIG. 1 uses the memory cell shown in FIGS. 4-6. Each memory cell comprises a first diode and a second diode connected in series, and the connection relationship between the two diodes is the same as the circuit structure of the memory cell P11 shown in FIG. 4.

For the OTP memory shown in FIG. 7, when data is written into each memory cell, a corresponding level is applied to a word line and a bit line which are connected to the memory cell, and a first diode of the memory cell is controlled to be in a breakdown or non-breakdown state, so as to specifically control the memory cell to store data "1" or to store data "0".

In some embodiments, the high level V3 may be 6V, then V1<6V<V2. When data is written into the memory cell P11 shown in FIG. 7, a voltage of 6V is applied to the word line WL1 connected to the memory cell P11, and a voltage of 0V is applied to the bit line BL1 connected to the memory cell P11, so that the first diode D1 of the memory cell P11 is broken down.

At the same time, in order to prevent a voltage of 6V applied to the word line WL1 from mistakenly breaking down the diodes in other memory cells on the word line, when a voltage of 6V is applied to the word line WL1, except that a voltage of 0V is applied to the bit line BL1 connected to the memory cell P11 to which data is to be written, a voltage V4 is applied to all other bit lines BL2, BL3 . . . , 0<V4<6V, and the voltage V4 may be designed according to a design window. For example, V4 in the example shown in FIG. 7 may be 3 V, or may be 2 V or 4 V in other specific implementations. At the same time, a voltage of 0V is applied to the other word lines WL2, WL3, . . . .

In conclusion, in the OTP memory provided in the embodiment of the present disclosure, a diode is used as a breakdown structure in each memory cell, so that each memory cell can determine whether the memory cell stores data "1" or data "0" according to whether the diode is broken down. Compared with a memory cell using a gate-oxide structure as a fuse path, since a gate structure is reduced, there is no limitation of a corresponding design rule (DRC), so that the volume of each memory cell is reduced, and thus the volume of the whole OTP memory is reduced, thereby relatively improving the degree of integration of the memory cell/OTP memory.

Figure 8:
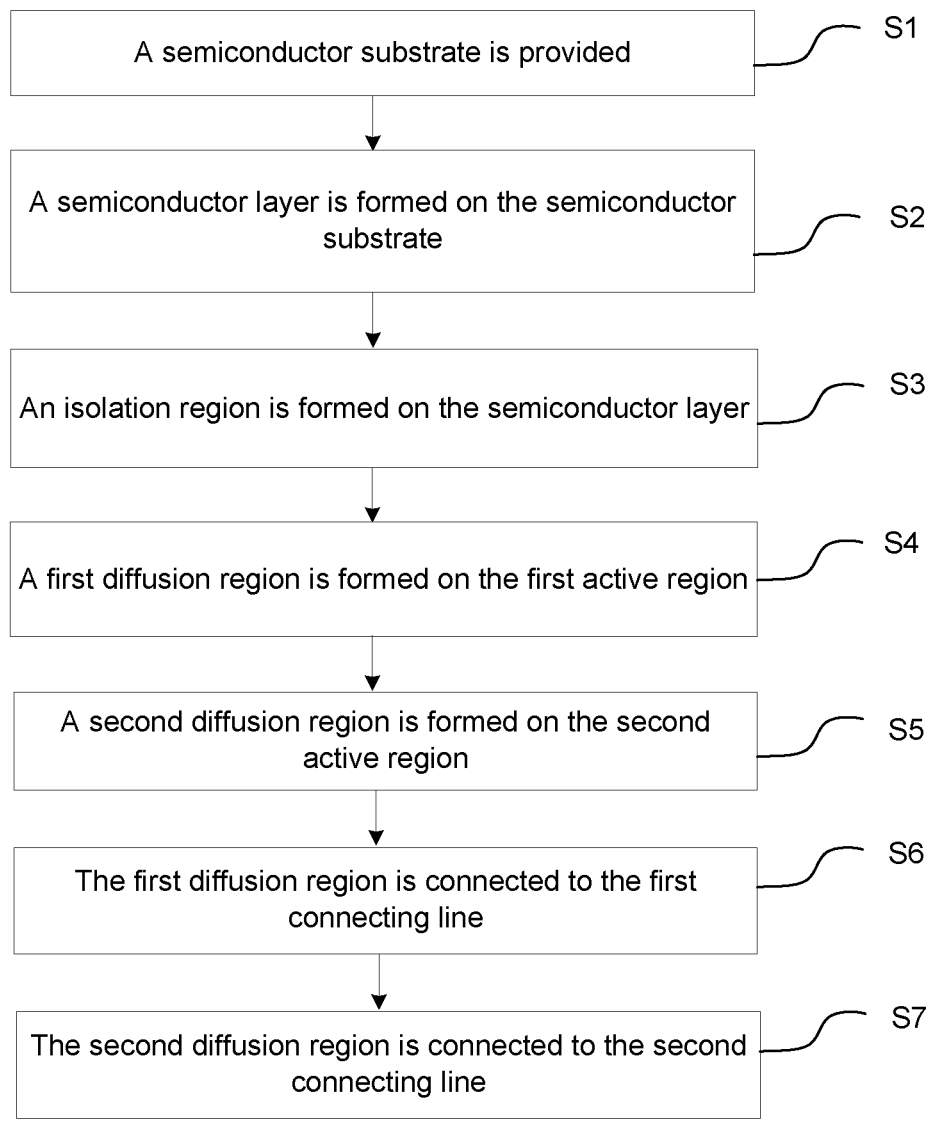
FIG. 8 is a schematic flowchart of a method for manufacturing a memory cell in an OTP memory provided in the present disclosure.

In some embodiments, the present disclosure further provides a method for manufacturing a semiconductor structure of a memory cell as shown in FIG. 5. FIG. 8 is a schematic flowchart of a method for manufacturing a memory cell in an OTP memory provided in the present disclosure. As shown in FIG. 8, the method comprises:

S1: a semiconductor substrate is provided, the semiconductor substrate may be a Si substrate, a Ge substrate, a SiGe substrate, an SOI or a GOI, etc., or may also be a substrate comprising other semiconductors or compound semiconductors, such as GaAs, InP or SiC, etc., or may also be a laminated structure, such as Si/SiGe, etc., or may also be other epitaxial structures, such as an SGOI.

Figure 9:
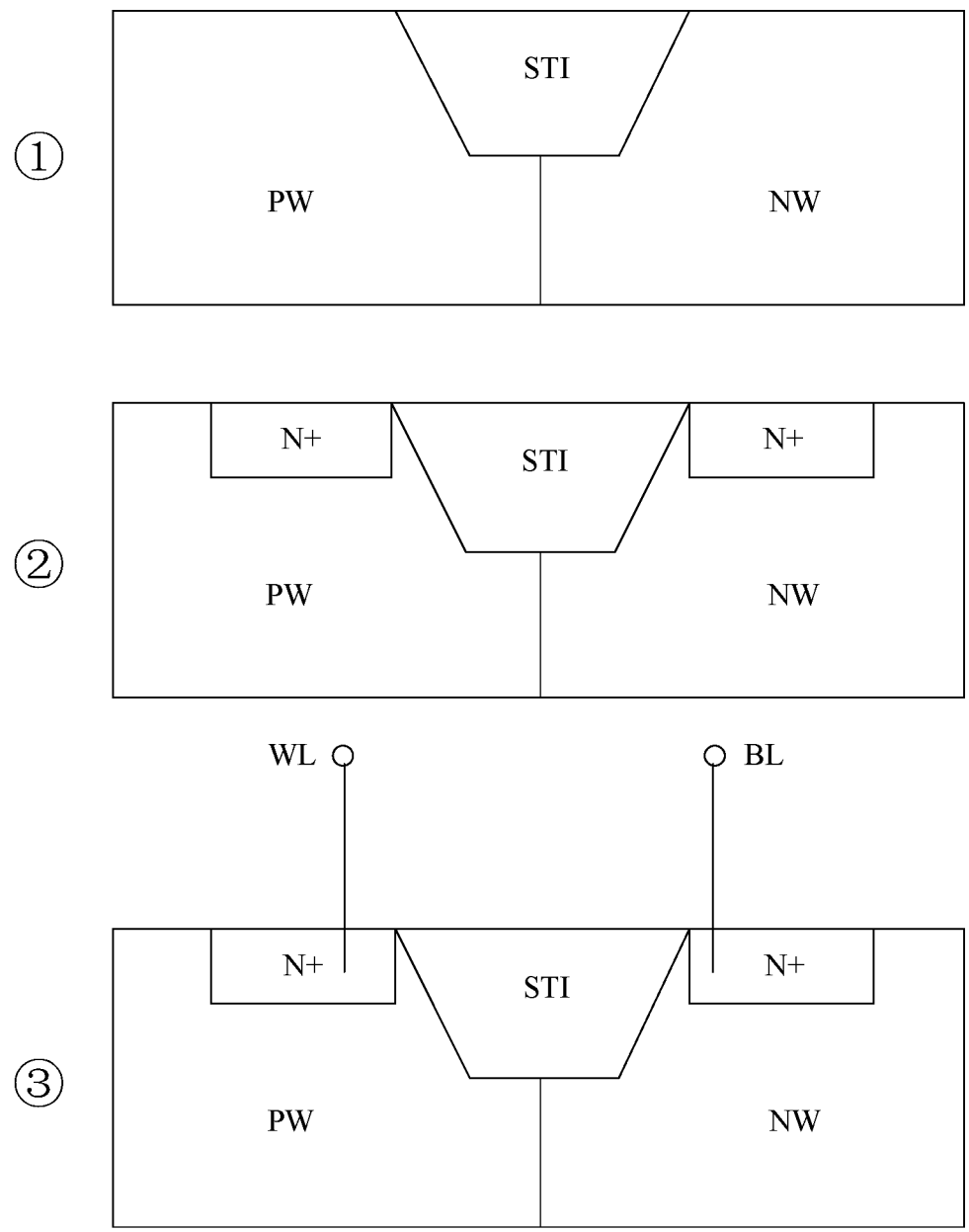
FIG. 9 is a schematic structural diagram of a method for manufacturing a memory cell in an OTP memory provided in the present disclosure.

S2: a semiconductor layer is formed on the semiconductor substrate, referring to FIG. 9, FIG. 9 is a schematic structural diagram of a method for manufacturing a memory cell in an OTP memory provided in the present disclosure, and as shown in state (1) of FIG. 9, the formed semiconductor layer comprises a first active region PW and a second active region NW, and a conductivity type of the first active region is different from a conductivity type of the second active region. In some embodiments, the first active region PW and the second active region NW may be formed on the semiconductor substrate respectively by different types of ion implantation.

S3: an isolation region STI is formed on the semiconductor layer; as shown in state (1) of FIG. 9, the isolation region is provided between the first active region and the second active region. In some embodiments, the isolation region STI may be formed by forming the first active region PW and the second active region NW, and then filling a trench between the two.

S4: a first diffusion region N+ is formed on the first active region PW; as shown in state (2) of FIG. 9, a conductivity type of the first active region (P type) is different from a conductivity type of the first diffusion region (N type).

S5: a second diffusion region is formed on the second active region NW;

the order of S4 and S5 is not limited.

S6: the first diffusion region N+ is connected to a first connecting line WL.

S7: the second diffusion region N+ is connected to a second connecting line BL; and the order of S6 and S7 is not limited.

For the specific structure and principle of the memory cell manufactured by the manufacturing method shown in FIG. 9, reference may be made to the embodiments shown in FIGS. 4-6, and details are not repeated herein.

Those skilled in the art can understand that all or part of steps for implementing the above process embodiments can be completed by program instructions related hardware. The programs above may be stored in a computer readable storage medium. When the program is executed, the steps comprising the above process embodiments are performed; and the above storage medium comprises diversifies of media being capable of storing program codes such as ROM, RAM, disk or optical disk and the like.

Finally, it should be noted that all the above embodiments are only used to illustrate the technical solution of the present disclosure, but not used as a limitation thereto. Although the present disclosure has been explained in details with reference to the above embodiments, it should be understood by those skilled in the art that, the technical solution described in the above respective embodiments still can be modified, or part or all of the technical features thereof can be equivalently substituted, and these modifications or substitutions cannot depart the essence of a corresponding technical solution from the scope of the technical solution according to the embodiments of present disclosure.

What is claimed is:

1. A One Time Programmable (OTP) memory, comprising:
a first active region, a second active region, and an isolation region provided between the first active region and the second active region, wherein a conductivity type of the first active region is different from a conductivity type of the second active region;
a first diffusion region provided on the first active region and configured to be connected to a first connecting line, wherein the conductivity type of the first active region is different from a conductivity type of the first diffusion region; and a second diffusion region provided on the second active region and configured to be connected to a second connection line, wherein the first active region is a P-type well, and the second active region is an N-type well, and wherein the first active region and the first diffusion region form a first diode; and the first active region and the second active region form a second diode.

2. The OTP memory according to claim 1, wherein the first diffusion region is an N-type diffusion region, and the second diffusion region is an N-type diffusion region.

3. The OTP memory according to claim 1, wherein a breakdown voltage of the first diode is less than a breakdown voltage of the second diode.

4. The OTP memory according to claim 1, wherein the first connecting line is a word line, and the second connecting line is a bit line.

5. A method for manufacturing a One Time Programmable (OTP) memory, comprising:

providing a semiconductor substrate;

forming a semiconductor layer on the semiconductor substrate, wherein the semiconductor layer comprises a first active region and a second active region, and a conductivity type of the first active region is different from a conductivity type of the second active region;

forming an isolation region on the semiconductor layer, the isolation region being provided between the first active region and the second active region;

forming a first diffusion region on the first active region, wherein the conductivity type of the first active region is different from a conductivity type of the first diffusion region;

forming a second diffusion region on the second active region;

connecting the first diffusion region to a first connecting line; and connecting the second diffusion region to a second connecting line;

wherein the first active region and the first diffusion region form a first diode; and the first active region and the second active region from a second diode.

6. The method for manufacturing the OTP memory according to claim 5, wherein the first active region is a P-type well, and the second active region is an N-type well.

7. The method for manufacturing the OTP memory according to claim 6, wherein the first diffusion region is an N-type diffusion region, and the second diffusion region is an N-type diffusion region.

8. The method for manufacturing the OTP memory according to claim 5, wherein a breakdown voltage of the first diode is less than a breakdown voltage of the second diode.

9. The method for manufacturing the OTP memory according to claim 5, wherein the first connecting line is a word line, and the second connecting line is a bit line.

\* \* \* \* \*